（12） United States Patent
Horiike et al.

(10) Patent No.: US 10,202,689 B2
(45) Date of Patent: Feb. 12, 2019

(54) LAMINATE AND GAS BARRIER FILM

(71) Applicant: Toppan Printing Co., Ltd., Tokyo (JP)

(72) Inventors: Takafumi Horiike, Tokyo (JP); Jin Sato, Tokyo (JP); Nao Takashima, Tokyo (JP)

(73) Assignee: Toppan Printing Co., Ltd., Tokyo (JP)

( * ) Notice: Subject to any disclaimer, the term of this patent is extended or adjusted under 35 U.S.C. 154(b) by 0 days.

(21) Appl. No.: 15/163,447

(22) Filed: May 24, 2016

(65) Prior Publication Data

US 2016/0265111 A1 Sep. 15, 2016

Related U.S. Application Data

(63) Continuation of application No. PCT/JP2014/082780, filed on Dec. 11, 2014.

(30) Foreign Application Priority Data

Dec. 11, 2013 (JP) .................. 2013-256411

(51) Int. Cl.
*C23C 16/455* (2006.01)
*C23C 16/40* (2006.01)
*B32B 7/12* (2006.01)
*B32B 27/08* (2006.01)
*B32B 27/28* (2006.01)
(Continued)

(52) U.S. Cl.
CPC .......... *C23C 16/45536* (2013.01); *B32B 7/12* (2013.01); *B32B 27/08* (2013.01); *B32B 27/281* (2013.01); *B32B 27/302* (2013.01); *B32B 27/32* (2013.01); *B32B 27/36* (2013.01); *C23C 16/405* (2013.01); *B32B 2307/584* (2013.01); *B32B 2307/7246* (2013.01); *B32B 2439/70* (2013.01); *B32B 2439/80* (2013.01); *B32B 2457/14* (2013.01)

(58) Field of Classification Search
CPC .................. C23C 16/45536; C23C 16/405
See application file for complete search history.

(56) References Cited

U.S. PATENT DOCUMENTS

2006/0210723 A1 9/2006 Ishizaka
2008/0053512 A1* 3/2008 Kawashima ...... B32B 17/10018
136/244
(Continued)

FOREIGN PATENT DOCUMENTS

JP 2000-138391 A 5/2000
JP 2004-106350 A 4/2004
(Continued)

OTHER PUBLICATIONS

Sasaki, Yasuhiro, JP 2012-182303, "Solar Cell Back Sheet", Sep. 20, 2012 (Machine Translation).*
(Continued)

*Primary Examiner* — Cheng Yuan Huang
(74) *Attorney, Agent, or Firm* — Foley & Lardner LLP

(57) ABSTRACT

A laminate (10) includes: a first substrate (11); an atomic layer deposition film (12) that is an inorganic oxide layer disposed on a first surface (11*a*) of the first substrate; a second substrate (14) disposed on one surface of the atomic layer deposition film; and a first adhesive layer (13) disposed between the atomic layer deposition film and the second substrate for adhering the atomic layer deposition film to the second substrate.

7 Claims, 1 Drawing Sheet

(51) Int. Cl.
*B32B 27/30* (2006.01)
*B32B 27/32* (2006.01)
*B32B 27/36* (2006.01)

(56) References Cited

U.S. PATENT DOCUMENTS

| | | | |
|---|---|---|---|
| 2011/0220184 A1* | 9/2011 | Aruga | B32B 7/12 136/251 |
| 2012/0003448 A1* | 1/2012 | Weigel | B32B 17/10018 428/212 |
| 2013/0327396 A1* | 12/2013 | Akaike | B32B 7/12 136/256 |

FOREIGN PATENT DOCUMENTS

| | | | |
|---|---|---|---|
| JP | 2012-096432 A | 5/2012 | |
| JP | 2012148561 A * | 8/2012 | |
| JP | 2012182303 A * | 9/2012 | |
| JP | 2013-502745 A | 1/2013 | |
| JP | 2013-28018 A | 2/2013 | |
| WO | WO-2013/015315 A1 | 1/2013 | |
| WO | WO-2013118570 A1 * | 8/2013 | H01L 31/049 |

OTHER PUBLICATIONS

Demirel et al. "Crystallization Behavior of PET Materials" BAÜ Fen Bil. Enst. Dergisi Cilt 13(I) 26-35 (2011).*
Kato Kiichiro et al., WO2013118570, Aug. 15, 2013 (Machine translation) (Year: 2013).*
International Search Report and Written Opinion of the International Searching Authority issued in International Patent Application No. PCT/JP2014/082780 dated Mar. 10, 2015.
Extended European Search Report issued in European Patent Application No. 14868846.8 dated Jul. 17, 2017.

* cited by examiner

LAMINATE AND GAS BARRIER FILM

CROSS-REFERENCE TO RELATED PATENT APPLICATIONS

This application is a continuation application filed under 35 U.S.C. § 111(a) claiming the benefit under 35 U.S.C. §§ 120 and 365(c) of PCT International Application No. PCT/JP2014/082780 filed on Dec. 11, 2014, which is based upon and claims the benefit of priority of Japanese Application No. 2013-256411, filed on Dec. 11, 2013, the entire contents of them all are hereby incorporated by reference.

TECHNICAL FIELD

The present invention relates to a laminate and a gas barrier film, and more particularly to a laminate including an atomic layer deposition film formed on a surface of a substrate by means of an atomic layer deposition method, and a gas barrier film including the laminate.

BACKGROUND

There are some methods, based on conventional art, for forming a film on a surface of an object, making use of a gaseous phase in which substances are permitted to move in a gas-like manner on an atomic or molecular basis. Such methods include chemical vapor deposition, which is hereinafter referred to as CVD, and physical vapor deposition, which is hereinafter referred to as PVD.

For example, PVD methods include vacuum vapor deposition, sputtering, and the like. Sputtering, which generally involves use of expensive devices, can form a film of high quality having good uniformity in quality and thickness. Therefore, sputtering is widely applied to display devices, such as liquid crystal displays.

In a CVD method, a material gas is introduced into a vacuum chamber and one, two or more gases are decomposed or reacted with each other on a substrate, using thermal energy to grow a solid film.

In this case, in order to promote reactions in film formation or to decrease reaction temperatures, plasma or catalyst reactions are often used in combination with the CVD method.

Of these CVD methods, one using a plasma reaction is referred to as a plasma enhanced CVD (PECVD) method, and one using catalyst reaction is referred to as a Cat-CVD method.

Use of the CVD methods mentioned above decreases defects in the films after being formed. Therefore, the CVD methods are applied, for example, to processing steps of fabricating semiconductor devices (e.g., steps of forming a gate insulating film).

In recent years, attention is focused on atomic layer deposition (ALD) methods as film-forming methods, hereinafter referred to as ALD methods.

In an ALD method, films are formed one by one on an atomic basis by chemical reaction of substances on a surface where the substances have been adsorbed. The ALD method is classified into the CVD method category.

In a so-called CVD method (typical CVD method), one or a plurality of gases are concurrently used for reaction on a substrate to grow a film. In contrast, in an ALD method, a highly active gas, which is also called a precursor (first precursor), and a reactive gas (called a precursor (second precursor) in the ALD method) are used in an alternate manner. Thus, the ALD method is a special film-forming method with which films are grown one by one on an atomic basis by adsorption and subsequent chemical reaction on a substrate surface.

The film-forming method based on the ALD method is specifically performed as follows.

First, using a so-called self-limiting effect, unreacted precursor is discharged after completing adsorption of one layer of precursor on a substrate (first step). The self-limiting effect is a phenomenon in which gas adsorption is no longer caused once a surface-adsorbing substrate is covered with a specific gas.

Then, a reactive gas is introduced into a chamber to oxidize or reduce the precursor to form one layer of film having a desired composition, followed by discharging the reactive gas (second step).

In the ALD method, the first and second steps are taken to be one cycle. The cycle is repeatedly performed to grow films on the substrate.

Thus, in the ALD method, films are two-dimensionally grown. The ALD method causes fewer defects in a film after being formed, compared with not only conventional vacuum vapor deposition, sputtering, and the like, but also with generally used CVD methods.

Therefore, the ALD method is expected to be applied to various fields such as of packaging for food products, pharmaceutical products, and the like, and electronic components.

As one ALD method, plasma is used for activating reactions in a step of decomposing the second precursor for reaction with the first precursor adsorbed on a substrate. This method is called plasma enhanced ALD (PEALD), or simply, plasma ALD.

The technique of the ALD method was proposed by Dr. Tuomo Sumtola of Finland in 1974. Typically, the ALD method, which provides high quality and high density films, is being actively applied to fabrication of semiconductor devices (e.g., steps of forming a gate insulating film). Mention has also been made accordingly in the International Technology Roadmap for Semiconductors (ITRS).

The ALD method, when compared with other film-forming methods, causes no shadowing effect, which is a phenomenon in which sputtering particles obliquely incident on a surface of a substrate cause unevenness in a film after being formed. Thus, the ALD method enables film formation as long as there is a gap into which a gas can enter.

Therefore, the ALD method is expected to be applied to coating of lines or holes on a substrate having a high aspect ratio of depth to width, or to MEMS (micro electro mechanical systems) related techniques used for coating three-dimensional structures.

However, the ALD method also suffers from problems. The problems include, for example, the necessity of using special materials, and cost increase due to the use of special materials, and the like. The biggest problem is that the film-forming speed is slow. The film-forming speed of the ALD method is very slow by a factor of about ⅕ to ¹⁄₁₀ compared with that of typical vacuum vapor deposition, sputtering, or the like.

Substrates on which films are formed by means of the ALD method mentioned above include, for example, small plate-like substrates, such as wafers and photomasks, inflexible substrates with a large area (e.g., glass substrate), and flexible substrates with a large area, such as films.

In mass production facilities for forming films on these substrates, there are proposed various methods of handling substrates, depending on cost, ease of handling, and quality of films to be formed, and the like, and the proposals are being put into practice.

For example, film-forming devices used in the case of forming a film on a wafer include single wafer film-forming devices or batch film-forming devices. In a single wafer film-forming device, one wafer is conveyed into a chamber of the device to form a film, followed by replacing the formed wafer with an unprocessed wafer, which is again followed by performing the film-forming treatment. In a batch film-forming device, a plurality of wafers are collectively placed in a chamber, followed by performing the same film-forming treatment with respect to all of the wafers.

Film-forming devices used in the case of forming a film on a glass substrate include in-line film-forming devices. In an in-line film-forming device, glass substrates are sequentially conveyed to a part serving as a film-forming source, with concurrent formation of a film.

Film-forming devices used in the case of forming a film on a flexible substrate include coating film-forming devices adopting so-called roll-to-roll processing. In a coating film-forming device, a film is formed while a flexible substrate is unrolled from a roller, and the flexible substrate is taken up by another roller.

The coating film-forming devices also include web coating film-forming devices for continuously forming a film, with the substrates targeted for film formation being conveyed on a flexible sheet or on partially flexible trays that can continuously convey the substrates.

The film-forming method and the substrate handling method of any of the film-forming devices can be combined, however, a film-forming device providing a combination that achieves a highest film-forming speed is typically used, taking account of cost, quality, ease of handling, and the like.

There are widely known laminates of conventional art, in which an atomic layer deposition film is formed on an outer surface of a substrate by means of the ALD method. For example, such a laminate is used as a gas barrier film having high gas barrier properties.

PTL 1 discloses a technique in which an atomic layer is vapor-deposited by the ALD method to form a barrier layer on a surface of a plastic film. According to this technique, the vapor-deposited atomic layer is formed by the ALD method, realizing a gas barrier film having good barrier properties.

CITATION LIST

Patent Literature

PTL 1: JP-A-2012-096432

SUMMARY OF THE INVENTION

Technical Problem

The atomic layer deposition film formed by the method described in PTL 1 is easily scratched (pin holes may be caused as well) by external force. When the atomic layer deposition film is scratched by external force, the scratch may reach the substrate.

When such a scratch is made, gas can flow in and out between the atomic layer deposition film and the substrate through the scratch, in the atmosphere after film formation. As a result, the gas barrier properties are deteriorated, or the lamination strength between the substrate and the atomic layer deposition film is lowered.

As another problem, when fabricating a gas barrier film having a laminate including an atomic layer deposition film which is easily scratched in this way, the gas barrier properties of the gas barrier film will be deteriorated unless a fabrication line is designed such that a rigid object is prevented from contacting the atomic layer deposition film after being formed.

Therefore, in the processing steps of fabricating a gas barrier film from a laminate, taking up of the gas barrier film into a roll can deteriorate the gas barrier properties of the film. Thus, there has been a problem that a gas barrier film having a laminate including an atomic layer deposition film cannot be conveyed and stored in a rolled state.

The present invention has been made in light of the circumstances set forth above, and has an object of providing a laminate that can minimize deterioration in the gas barrier properties and the lamination strength between a substrate and an atomic layer deposition film formed on an outer surface of the substrate, and can minimize deterioration in the gas barrier properties if the laminate is conveyed and stored in a rolled state, by preventing the atomic layer deposition film from being easily scratched due to external force, and providing a gas barrier film having the laminate.

Solution to Problem

To solve the problems set forth above, a laminate according to a first aspect of the present invention includes: a first substrate; an atomic layer deposition film that is an inorganic oxide layer disposed on a first surface of the first substrate; a second substrate disposed on one surface of the atomic layer deposition film; and a first adhesive layer disposed between the atomic layer deposition film and the second substrate to adhere the atomic layer deposition film to the second substrate.

According to the above representative aspect of the present invention, the second substrate is attached to a first surface of the atomic layer deposition film via the first adhesive layer so as to cover the first surface. Thus, the second substrate serves as a substrate for protecting the first surface of the atomic layer deposition film, thereby preventing the first surface of the atomic layer deposition film from being damaged by external force. Specifically, the second substrate can prevent formation of a scratch, caused by external force, with a depth reaching the first substrate from the first surface of the atomic layer deposition film.

Thus, deterioration due to external force can be minimized in respect of gas barrier properties and lamination strength between the substrate and the atomic layer deposition film. Also, deterioration in the gas barrier properties can be minimized when the laminate is conveyed and stored in a rolled state.

The first surface of the atomic layer deposition film may be subjected to surface treatment to enhance affinity for the first adhesive. The surface treatment for enhancing affinity may be any of corona treatment, plasma treatment, and ozone treatment.

Thus, using the first surface of the atomic layer deposition film, where affinity for the adhesive is enhanced, adhesiveness of the second substrate to the first surface of the atomic layer deposition film can be enhanced.

The laminate may include: a third substrate disposed on a second surface of the first substrate, the second surface being on an opposite side to the first surface; and a second adhesive layer disposed between the atomic layer deposition film and the third substrate to adhere the atomic layer deposition film to the third substrate.

With this configuration where the substrates (the second and the third substrates) are disposed on both surfaces (the first and the second surfaces) of the first substrate, the second substrate can contribute to enhancing durability of the laminate.

The atomic layer deposition film may have a thickness in a range of 2 nm or more to 500 nm or less.

The atomic layer deposition film, if its thickness is smaller than 2 nm, may have a difficulty in sufficiently serving as a gas barrier layer. If the thickness of the atomic layer deposition film is greater than 500 nm, cracks will be easily caused by the internal stresses in the atomic layer deposition film. If the thickness of the atomic layer deposition film is greater than 500 nm, it may be difficult to control optical properties (e.g., light transmittance).

Accordingly, the atomic layer deposition film with a thickness in a range of 2 nm or more to 500 nm or less can sufficiently serve as a gas barrier layer, while reducing occurrence of cracks and enabling control of the optical properties.

The atomic layer deposition film may contain any one or more of Al, Ti, Si, Zn, and Sn.

Being configured by the above material, the atomic layer deposition film can be formed by the ALD method, and can serve as a gas barrier layer (barrier layer).

A gas barrier film according to a second aspect of the present invention includes the laminate according to the first aspect.

The gas barrier film including the laminate of the first aspect can improve reliability of the gas barrier film.

Advantageous Effects of the Invention

The laminate and the gas barrier film according to the above aspects can prevent the atomic layer deposition film formed on a surface of the substrate from being easily scratched due to external force, thereby minimizing deterioration in the gas barrier properties and the lamination strength between the substrate and the atomic layer deposition film. Further, when the laminate is conveyed and stored in a rolled state, deterioration in the gas barrier properties can be minimized.

DESCRIPTION OF THE REPRESENTATIVE EMBODIMENTS

Figure 1:
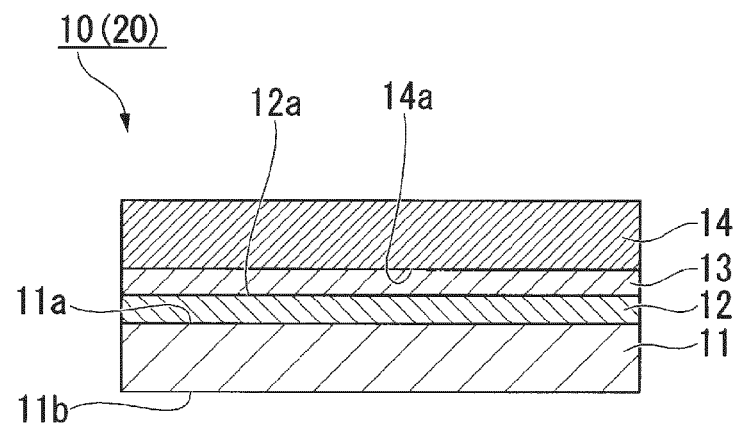
FIG. 1 is a cross-sectional view illustrating a schematic configuration of a laminate (gas barrier film) according to a first embodiment of the present invention.

With reference to the drawings, hereinafter will be specifically described some embodiments to which the present invention is applied. The drawings referred to in the following description are for explaining the configurations of the embodiments of the present invention. The sizes, thicknesses, dimensions and the like of the components illustrated in the drawings may be different from the actual dimensional relationship between the laminate and the gas barrier film.

First Embodiment

FIG. 1 is a cross-sectional view illustrating a schematic configuration of a laminate (gas barrier film) according to a first embodiment of the present invention. In the first embodiment, a laminate 10 shown in FIG. 1 is in a film-like shape. The film-shaped laminate 10 has a structure corresponding to a gas barrier film 20 of the first embodiment.

Referring to FIG. 1, the laminate 10 (gas barrier film 20) of the first embodiment has a structure in a film-like shape, having a first substrate 11, an atomic layer deposition film 12 that is an inorganic oxide layer, a first adhesive layer 13, and a second substrate 14.

The first substrate 11 has a flat first surface 11a, and a flat second surface 11b disposed on the opposite side of the first surface 11a. The first surface 11a is used for forming the atomic layer deposition film 12 thereon.

For example, as the first substrate 11, which is preferably transparent, a film-shaped substrate made of a plastic material can be used.

Materials that can be used for the first substrate 11 include, for example, plastic materials, such as polyethylene terephthalate (PET), polyethylene naphthalate (PEN), a polyimide film (PI), polyethylene (PE), polypropylene (PP), and polystyrene (PS).

Materials for the first substrate 11 are not limited to the above-mentioned materials, but can be appropriately selected, taking account of heat resistance, physical strength, electrical insulating properties, and the like.

The material of the first substrate 11 has a glass transition point (Tg) which is preferably, but is not limited to, 50° C. or more. By setting the glass transition point (Tg) of the material of the first substrate 11 to a temperature of 50° C. or more, heat resistance can be improved.

For example, the thickness of the first substrate 11 can be appropriately selected from a range of 12 μm or more to 200 μm or less, taking account of the suitability to packaging materials for electronic components or precision components, such as electroluminescent elements, to which the laminate 10 is applied, and the suitability for processing the gas barrier film 20.

The atomic layer deposition film 12 is disposed on the first surface 11a of the first substrate 11. The atomic layer deposition film 12 is formed by the ALD method to serve as a gas barrier layer (barrier layer).

Films that can be used as the atomic layer deposition film 12 include, for example, inorganic oxide films made such as of $AlO_x$, $TiO_x$, $SiO_x$, $ZnO_x$ or $SnO_x$, or nitride films or oxynitride films made of these inorganic substances, or oxide films, nitride films or oxynitride films made of other elements. The atomic layer deposition film 12 may be, for example, any of these films or any of mixed films of elements (e.g., Al, Ti, Si, Zn or Sn). Preferably, the atomic layer deposition film 12 contains any of Al, Ti, Si, Zn, and Sn.

It is particularly preferable that the atomic layer deposition film 12 is formed containing at least one of elements, Al, Ti, and Si among these materials, from the viewpoint of achieving high gas barrier properties and high durability and reducing cost.

The thickness of the atomic layer deposition film 12 can be in a range of 2 nm or more to 500 nm or less, for example. The atomic layer deposition film 12, if its thickness is smaller than 2 nm, will have difficulty sufficiently serving as a gas barrier layer.

On the other hand, if the thickness of the atomic layer deposition film is greater than 500 nm, cracks are likely to occur due to internal stresses in the atomic layer deposition film. If the thickness of the atomic layer deposition film is greater than 500 nm, it will be difficult to control the optical properties (e.g., light transmittance) of the film.

Therefore, by permitting the atomic layer deposition film to have a thickness in a range of 2 nm or more to 500 nm or less, the function as a gas barrier layer can be sufficiently exerted, the occurrence of cracks can be reduced, and the optical properties can be controlled.

For example, the thickness of the atomic layer deposition film 12 is more preferably in a range of 2 nm or more to 100 nm or less.

The atomic layer deposition film 12 has one surface 12a (top surface) on which the first adhesive layer 13 (adhesive layer for adhering the second substrate 14 to the surface 12a of the atomic layer deposition film 12) is disposed. It is preferable, for example, that the surface 12a of the atomic layer deposition film 12 has been treated to enhance affinity for an adhesive. As the treatment for enhancing affinity, corona treatment, plasma treatment, ozone treatment, or the like can be used.

As described above, the surface 12a of the atomic layer deposition film 12 is subjected to surface treatment to enhance adhesion between the first substrate 11 and the second substrate 14, when laminating the first adhesive layer 13 on the surface 12a and attaching the second substrate 14 to the first adhesive layer 13. Thus, the laminate 10 can have high gas barrier properties.

The first adhesive layer 13 is disposed between the surface 12a of the atomic layer deposition film 12 and one surface 14a of the second substrate 14 to adhere the atomic layer deposition film 12 to the second substrate 14. The first adhesive layer 13 is disposed so as to cover the surface 12a of the atomic layer deposition film 12 and the surface 14a of the second substrate 14.

In other words, the first adhesive layer 13 is provided to attach the second substrate 14 to the surface 12a of the atomic layer deposition film 12.

The first adhesive layer 13 can be formed, for example, by providing a coating of a dry lamination adhesive, followed by curing the dry lamination adhesive.

As a dry lamination adhesive for serving as a base material of the first adhesive layer 13, an adhesive containing a base resin and a curing agent as principal components can be used, for example. In this case, the dry lamination adhesive can contain a resin compound having a plurality of hydroxyl groups in a molecule and a polyisocyanate compound.

It is preferable that, as the dry lamination adhesive, a base resin containing a resin compound is mixed with a curing agent containing a polyisocyanate compound immediately before use.

As the base resin configuring the dry lamination adhesive, a resin compound having a plurality of hydroxyl groups in a molecule can be used, for example. Materials that can be used for the resin compound include, but are not limited to, polyester polyols, polyurethane polyols, polycarbonate polyols, acrylic polyols, polyether polyols, polyolefin polyols, and the like.

As the curing agent configuring the dry lamination adhesive, materials containing a polyisocyanate compound can be used, for example. As the polyisocyanate compound, compounds having two or more isocyanate groups in one molecule can be used, for example.

In the polyisocyanate compound mentioned above, the isocyanate group is reacted with the hydroxyl groups of the above base resin to thereby form cross-links. The polyisocyanate compound is not particularly limited, but only has to be one that can cross-link the base resin.

After being coated over the surface 14a of the second substrate 14, the dry lamination adhesive is subjected to heating or blowing to remove the solvent contained in the dry lamination adhesive, followed by curing. Thus, the first adhesive layer 13 is formed.

Coating methods that can be used for coating the dry lamination adhesive over the surface 14a of the second substrate 14 include, but are not limited to, a gravure coater method, roll coater method, wire bar coating method, and brushing method.

The thickness of the first adhesive layer 13 can be set, for example, to a range of 1.0 to 10 μm. However, the range is not limited to this as long as desired adhesion and optical properties are ensured.

The second substrate 14 is attached to the surface 12a of the atomic layer deposition film 12 via the first adhesive layer 13 to cover the surface 12a.

In this way, the laminate includes the second substrate 14 attached to the surface 12a of the atomic layer deposition film 12 via the first adhesive layer 13 to cover the surface 12a. Thus, the second substrate 14 can protect the surface 12a of the atomic layer deposition film 12. This leads to minimizing damage caused by external force on the surface 12a of the atomic layer deposition film 12. Specifically, the damage refers to scratches formed by external force, with a depth reaching the first substrate 11 from the surface 12a of the atomic layer deposition film 12. Specifically, minimizing the damage caused on the surface 12a of the atomic layer deposition film 12 refers to minimizing the possibility of forming a scratch on the atomic layer deposition film 12, causing a gas to flow in and out of the atomic layer deposition film 12 in the thickness direction. The same applies to the following description.

Thus, deterioration can be minimized in respect of the gas barrier properties and the lamination strength between the substrate and the atomic layer deposition film due to external force.

As the second substrate 14, a film-shaped substrate made of a plastic material, which is preferably transparent, can be used, for example.

Materials that can be used for the second substrate 14 include, for example, plastic materials, such as polyethylene terephthalate (PET), polyethylene naphthalate (PEN), a polyimide film (PI), polyethylene (PE), polypropylene (PP), and polystyrene (PS).

Materials used for the second substrate 14 are not limited to the materials set forth above, but can be appropriately selected, taking into account of heat resistance, physical strength, electrical insulating properties, and the like.

The material used for the second substrate 14 has a glass transition point (Tg) which is preferably, but not limited to, 50° C. or more. By setting the glass transition point (Tg) of the material used for the second substrate 14 to 50° C. or more, heat resistance can be improved.

For example, the second substrate 14 can have a thickness appropriately selected from a range which is 12 μm or more to 200 μm or less, but is not limited to this range.

As described above, the laminate 10 (gas barrier film 20) of the first embodiment includes the second substrate 14 which is attached to the surface 12a of the atomic layer deposition film 12 via the first adhesive layer 13 so as to cover the surface 12a of the atomic layer deposition film 12. Thus, the second substrate 14 can protect the surface 12a of the atomic layer deposition film 12. As a result, the surface 12a of the atomic layer deposition film 12 can be prevented from being damaged by external force.

Accordingly, deterioration due to external force can be minimized in respect of the gas barrier properties and the lamination strength between the substrate and the atomic layer deposition film, and also in respect of the gas barrier properties when the laminate 10 is conveyed and stored in a rolled state.

In other words, the reliability of the gas barrier film 20 of the first embodiment can be improved.

Referring now to FIG. 1, a method for fabricating the laminate 10 (gas barrier film 20) according to the first embodiment will be briefly described.

First, the atomic layer deposition film 12 is formed on the first surface 11a of the first substrate 11 by using a known ALD method.

Then, the surface 12a of the atomic layer deposition film 12 is subjected to surface treatment to enhance affinity for an adhesive. As the surface treatment, corona treatment, plasma treatment, ozone treatment, or the like can be used.

Then, a dry lamination adhesive that is a base material of the first adhesive layer 13 is coated over the surface 14a of the second substrate 14. Methods of coating the dry lamination adhesive that can be used include, but are not limited to, a gravure coater method, roll coater method, wire bar coating method, and brushing method. At this stage, the dry lamination adhesive is yet to be cured.

Then, the second substrate 14 is attached to the surface 12a of the atomic layer deposition film 12 via the dry lamination adhesive. Thus, the second substrate 14 is temporarily attached to the atomic layer deposition film 12 to form a joined body (laminate 10 in which the dry lamination adhesive is yet to be cured).

The joined body is stored in a state of being taken up, for example, and left to stand for a predetermined period. During the period of being left, inside the dry lamination adhesive configuring the joined body, the hydroxyl groups of the resin compound contained in the base resin react with the isocyanate groups of the polyisocyanate compound contained in the curing agent to accelerate the reaction of forming urethane bonds.

Through the reaction, the resin compound is cross-linked by the polyisocyanate compound and achieves high molecular weight. After the resin compound has been sufficiently cross-linked, the above dry lamination adhesive layer is cured to serve as the first adhesive layer 13. Thus, the atomic layer deposition film 12 is firmly joined to the second substrate 14, thereby fabricating the laminate 10 (gas barrier film 20).

The laminate 10 is used as shown in FIG. 1, when used as the gas barrier film 20.

Second Embodiment

Figure 2:
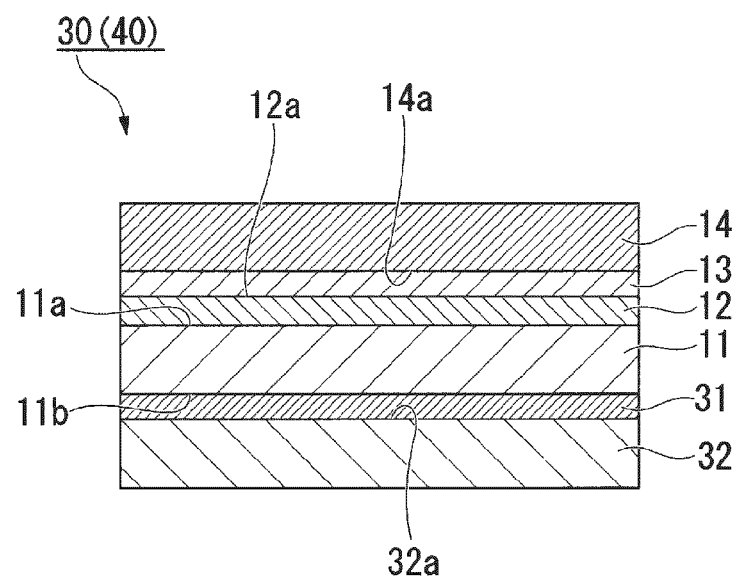
FIG. 2 is a cross-sectional view illustrating a schematic configuration of a laminate (gas barrier film) according to a second embodiment of the present invention.

FIG. 2 is a cross-sectional view illustrating a schematic configuration of a laminate (gas barrier film) according to a second embodiment of the present invention.

In FIG. 2, components which are identical with those of the laminate 10 (gas barrier film 20) of the first embodiment shown in FIG. 1 are given the same reference signs.

In the second embodiment, a laminate 30 shown in FIG. 2 is in a film-like shape. The film-shaped laminate 30 has a structure corresponding to a gas barrier film 40 of the second embodiment.

As shown in FIG. 2, the laminate 30 (gas barrier film 40) of the second embodiment is configured in a manner similar to the laminate 10 (gas barrier film 20) of the first embodiment, except that the laminate 30 includes a second adhesive layer 31 and a third substrate 32 in addition to the configuration of the laminate 10 (gas barrier film 20) of the first embodiment.

The second adhesive layer 31 is disposed between the second surface 11b of the first substrate 11 and one surface 32a of the third substrate 32 to adhere the first substrate 11 to the third substrate 32. In other words, the second adhesive layer 31 is used for attaching the surface 32a of the third substrate 32 to the second surface 11b of the first substrate 11.

As the second adhesive layer 31, materials similar to those used for the first adhesive layer 13 described in the first embodiment can be used. The second adhesive layer 31 can have a thickness similar to the first adhesive layer 13.

The third substrate 32 is attached to the second surface 11b of the first substrate 11 via the second adhesive layer 31. The third substrate 32 is in a film-like shape.

Materials that can be used for the third substrate 32 are similar to those used for the second substrate 14 described in the first embodiment, for example. However, materials used for the third substrate 32 are not limited to these materials, but can be appropriately selected, taking account of heat resistance, physical strength, electrical insulating properties, and the like.

The material used for the third substrate 32 has a glass transition point (Tg) which is preferably 50° C. or more, but is not limited to this temperature. By setting the glass transition point (Tg) of the material used for the third substrate 32 to 50° C. or more, heat resistance can be improved.

For example, the third substrate 32 can have a thickness appropriately selected from a range which is 12 µm or more to 200 µm or less, but is not limited to this range.

The laminate 30 (gas barrier film 40) of the second embodiment includes the third substrate 32, in addition to the configuration of the laminate 10 of the first embodiment. The third substrate 32 has the surface 32a which is attached to the second surface 11b of the first substrate 11 via the second adhesive layer 31. Thus, the substrates (second and third substrates 14 and 32) are disposed on both surfaces (first and second surfaces 11a and 11b) of the first substrate 11, thereby improving durability of the laminate 30.

The laminate 30 (gas barrier film 40) of the second embodiment can obtain advantageous effects similar to those of the laminate 10 (gas barrier film 20) of the first embodiment. Specifically, deterioration can be minimized in respect of the gas barrier properties and the lamination strength between the first substrate 11 and the atomic layer deposition film 12 due to external force. Further, if the laminate 30 is conveyed and stored in a rolled state, deterioration of the gas barrier properties can be minimized.

Preferred embodiments of the present invention have so far been specifically described. However, the present invention is not limited to these specific embodiments, but can be variously modified and altered within the spirit of the present invention provided in the claims.

The following description sets forth examples and comparative examples of the present invention. However, the present invention is not limited to the following examples.

Example 1

<Preparation of Laminate of Example 1>

In Example 1, the laminate 10 shown in FIG. 1 (hereinafter, the laminate 10 of Example 1 is referred to as a laminate 10-1) was prepared using a method shown below.

First, a PET film with a thickness of 100 µm was prepared as the first substrate 11. Then, a $TiO_2$ film (barrier layer), as the atomic layer deposition film 12, was formed on the first surface 11a of the PET film using the ALD method by means of OpAL (model number), an ALD device manufactured by Oxford Instruments plc.

In forming the $TiO_2$ film, titanium tetrachloride ($TiCl_4$) was used as a material gas.

Concurrently with the supply of the material gas, $N_2$ as a process gas, $O_2$ and $N_2$ as purge gases, and $O_2$ as both a reaction gas and a plasma discharge gas were supplied into a film-forming chamber. In this case, the pressure inside the deposition chamber was set to 10 to 50 Pa.

A power supply of 13.56 MHz was used as a plasma excitation power supply to perform plasma discharge in an ICP mode.

Durations of supplying the gases were set as follows. Specifically, duration of TiCl4 and the process gas was set to 1 sec, duration of the purge gas was set to 60 sec, and duration of the reaction/discharge gas was set to 5 sec.

Then, concurrently with the supply of the reaction/discharge gas, plasma was discharged in the ICP mode. The output power of the plasma discharge at this time was 250 watts. As a gas purge after plasma discharge, purge gases of $O_2$ (supply amount of 60 sccm) and N2 (supply amount of 100 sccm) were supplied for 4 sec. The temperature for forming the $TiO_2$ film was set to 90° C.

Film-forming speed for the $TiO_2$ film under the cycle conditions set forth above was as follows. Specifically, since a unit film-forming speed was about 1.1 Å/cycle, 176 cycles of film-forming treatment were performed to form a film with a thickness of 20 nm. The total time for forming the film was 253 min.

Then, one surface (the surface 12a of the atomic layer deposition film 12) of the $TiO_2$ film was subjected to surface treatment. Specifically, plasma was discharged using OpAL (model number), i.e. an ALD device manufactured by Oxford Instruments plc, in the ICP mode, so that one surface of the $TiO_2$ film was surface-treated.

As the surface treatment conditions at this time, the output power was set to 300 watt, the supply amount of the $N_2$ gas was set to 100 sccm, and the treatment time was set to 30 sec.

Then, a PET film, as the second substrate 14, with a thickness of 100 μm was attached onto the atomic layer deposition film 12 on the first surface (first surface 11a of the first substrate 11) side of the PET film, via the first adhesive layer 13 made of a base resin containing a resin compound and a curing agent containing a polyisocyanate compound. Thus, the laminate 10-1 according to Example 1 was prepared. In this case, the first adhesive layer 13 had a thickness of 10 μm.

Two laminates 10-1 were formed in Example 1.

<Measurement of Lamination strength and Water Vapor Transmission Rate of Laminates according to Example 1>

Then, as accelerated durability tests for the laminates 10-1 of Example 1, the laminates 10-1 were measured in respect of the lamination strength and the water vapor transmission rate (WVTR) before and after being exposed to an environment of a predetermined temperature and humidity.

In the measurement, EHS211MD (model number), i.e. a high acceleration life test device, manufactured by Espec Corp. was used as a device for exposing the two laminates 10-1 to an environment of a predetermined temperature and humidity.

The environment of a predetermined temperature and humidity used in this case was 105° C./100% RH. When measuring the lamination strength, the laminates 10-1 were exposed to the above environment of temperature and humidity for 96 hours. When measuring the water vapor transmission rate, the laminates 10-1 were exposed to the above environment of temperature and humidity for 24 hours.

One of the laminates 10-1 was cut in a width of 10 mm to prepare a sample for use in measuring lamination strength. The lamination strength was measured with 180-degree peeling between the $TiO_2$ film and the second substrate 14 configuring the prepared sample.

In this case, as a device for testing lamination strength, a Tensilon Universal tester RTC-1250 (model number) manufactured by Orientec Co., LTD. was used. The peeling speed was 300 mm/min.

As a result, the lamination strength before the accelerated durability test was 6.7 (N/10 mm). The lamination strength after the accelerated durability test was 5.2 (N/10 mm).

The term "before the accelerated durability test" means before exposing the laminate to the predetermined temperature and humidity environment. The term "after the accelerated durability test" means after exposing the laminate to the predetermined temperature and humidity environment. The same applies to the following description.

The water vapor transmission rate was measured in a 40° C./90% RH atmosphere by means of MOCON Aquatran™, i.e. a water vapor permeability measurement device, manufactured by Modern Control, Inc., or MOCON Prematran™, i.e. a water vapor permeability measurement device, manufactured by Modern Control, Inc.

As a result, the water vapor transmission rate before the accelerated durability test was $5.0 \times 10^{-3}$ (g/m$^2$/day). The water vapor transmission rate after the accelerated durability test was $7.0 \times 10^{-3}$ (g/m$^2$/day).

Table 1 shows lamination strength and water vapor transmission rate of the laminates 10-1 of Example 1 measured using the above method. Table 1 also shows the results of measurements of laminates according to examples 2 and 3 and comparative examples 1 to 5.

Table 1 also shows the type, thickness and film-forming method of the barrier layers associated with examples 1 to 3 and comparative examples 1 to 5, as well as whether there are other substrates (specifically, the second substrate 14 shown in FIGS. 1 and 2, and the third substrate 32 shown in FIG. 2) attached to the first substrate, and whether surface treatment has been performed on the barrier layers in these examples and comparative examples.

TABLE 1

|  | Barrier layer | Other base materials attached to first substrate? | Barrier layer is surface treated? | Lamination strength (N/10 mm) | | | Water vapor transmission rate (g/m$^2$/day) | | | |
|---|---|---|---|---|---|---|---|---|---|---|
|  |  |  |  | Before accelerated durability test | After accelerated durability test | Before accelerated durability test | After accelerated durability test | Before take-up | After take-up |
| Ex. 1 | $TiO_2$ film (20 nm, ALD) | Yes | Yes | 6.7 | 5.2 | $5.0 \times 10^{-3}$ | $7.0 \times 10^{-3}$ | — | — |
| Ex. 2 | $TiO_2$ film (20 nm, ALD) | Yes (above and below) | Yes | 7.0 | 5.4 | $4.2 \times 10^{-3}$ | $6.3 \times 10^{-3}$ | — | — |
| Ex. 3 | $TiO_2$ film (20 nm, ALD) | Yes | Yes | — | — | — | — | $5.0 \times 10^{-3}$ | $6.7 \times 10^{-3}$ |

TABLE 1-continued

| | Barrier layer | Other base materials attached to first substrate? | Barrier layer is surface treated? | Lamination strength (N/10 mm) Before accelerated durability test | After accelerated durability test | Water vapor transmission rate (g/m²/day) Before accelerated durability test | After accelerated durability test | Before take-up | After take-up |
|---|---|---|---|---|---|---|---|---|---|
| Comp. ex. 1 | SiO$_2$ film (20 nm, CVD) | Yes | Yes | — | — | $2.0 \times 10^{-2}$ | — | — | — |
| Comp. ex. 2 | TiO$_2$ film (20 nm, ALD) | No | No | — | — | $5.5 \times 10^{-3}$ | $9.5 \times 10^{-4}$ | — | — |
| Comp. ex. 3 | TiO$_2$ film (20 nm, ALD) | No | No | — | — | — | — | $5.5 \times 10^{-3}$ | $2.0 \times 10^{-4}$ |
| Comp. ex. 4 | TiO$_2$ film (1 nm, ALD) | Yes | Yes | — | — | 1.4 | — | — | — |
| Comp. ex. 5 | TiO$_2$ film (20 nm, ALD) | Yes | No | 2.0 | 0.8 | — | — | — | — |

Example 2

<Preparation of Laminate According to Example 2>

In Example 2, the laminate 30 shown in FIG. 2 (hereinafter, the laminate 30 of Example 2 is referred to as laminate 30-1) was prepared using a method shown below.

Specifically, after preparing the laminate 10-1 of Example 1, one surface of a PET film (the surface 32a of the third substrate 32) with a thickness of 100 μm was attached to a second surface of a PET film (the second surface 11b of the first substrate 11) with a thickness of 100 μm via the second adhesive layer 31 made of a base resin and a curing agent. Thus, the laminate 30-1 of Example 2 was prepared.

In this case, an adhesive layer used as the second adhesive layer 31 was the same type as that of the first adhesive layer 13 described in Example 1. The second adhesive layer 31 had the same thickness as that of the first adhesive layer 13 described in Example 1.

<Measurement of Lamination Strength and Water Vapor Transmission Rate of Laminate according to Example 2>

The conditions and devices of Example 1 and a method similar to Example 1 were used to measure lamination strength and water vapor transmission rate of the laminate 30-1 of Example 2.

As a result, the lamination strength before the accelerated durability test was 7.0 (N/10 mm). The lamination strength after the accelerated durability test was 5.4 (N/10 mm).

The water vapor transmission rate before the accelerated durability test was $4.2 \times 10^{-3}$ (g/m²/day). The water vapor transmission rate after the accelerated durability test was $6.3 \times 10^{-3}$ (g/m²/day).

Example 3

A method similar to Example 1 was used to prepare a laminate 10-2 of Example 3 with a configuration similar to the laminate 10-1 of Example 1.

Then, the water vapor transmission rate was measured before and after having a take-up roller with a diameter of 300 mm take up the laminate 10-2. In this case, the devices mentioned in Example 1 were used for measuring water vapor transmission rate.

As a result, the water vapor transmission rate of the laminate 10-2 before being taken up was $5.0 \times 10^{-3}$ (g/m²/day), while the water vapor transmission rate of the laminate 10-2 after being taken up was $6.7 \times 10^{-3}$ (g/m²/day).

Comparative Example 1

A laminate of Comparative Example 1 (hereinafter referred to as a laminate A) was prepared by a method similar to Example 1, except that the method included a different step of forming a barrier layer and not included a step of attaching the second substrate 14 via the first adhesive layer 13.

In Comparative Example 1, using a CVD method, i.e. a dry coating technique different from the atomic layer deposition method, an SiO$_2$ film (barrier layer) with a thickness of 20 nm was formed on a first surface (the first surface 11a of the first substrate 11) of a PET film having a thickness of 100 μm.

After that, without performing an accelerated durability test, a water vapor transmission rate before accelerated durability test was measured using a method similar to Example 1, which resulted in $2.0 \times 10^{-2}$ (g/m²/day).

Comparative Example 2

A laminate of Comparative Example 2 (hereinafter referred to as a laminate B) was prepared using a method similar to Example 1, except that the method did not include the step of surface-treating the barrier layer and the step of attaching the second substrate 14 via the first adhesive layer 13.

After that, water vapor transmission rate of the laminate B according to Comparative Example 2 was measured before and after accelerated durability test (test similar to the accelerated durability test described in Example 1). In this case, the water vapor transmission rate of the laminate B was measured using the devices mentioned in Example 1.

As a result, the water vapor transmission rate before the accelerated durability test was $5.5 \times 10^{-3}$ (g/m²/day). Further, the water vapor transmission rate after the accelerated durability test was $9.5 \times 10^{-1}$ (g/m²/day).

Comparative Example 3

In Comparative Example 3, a method similar to Comparative Example 2 described above was used to prepare a laminate C with a configuration similar to the laminate B of Comparative Example 2. After that, without performing accelerated durability test, the water vapor transmission rate was measured before and after having a take-up roller with a diameter of 300 mm taken up the laminate C. In this case, the devices mentioned in Example 1 were used for measuring the water vapor transmission rate.

As a result, the water vapor transmission rate of the laminate C before being taken up was $5.5 \times 10^{-3}$ (g/m²/day), while the water vapor transmission rate of the laminate C after being taken up was $2.0 \times 10^{-1}$ (g/m²/day).

Comparative Example 4

In Comparative Example 4, a laminate D was prepared using a method similar to the one used for the laminate 10-1 of Example 1, except that the TiO$_2$ film, as a barrier layer, was permitted to have a thickness of 1 nm.

After that, without performing an accelerated durability test, the water vapor transmission rate of the laminate D of Comparative Example 4 was measured. In this case, the water vapor transmission rate of the laminate D was measured using the devices mentioned in Example 1.

As a result, the water vapor transmission rate before the accelerated durability test was 1.4 (g/m$^2$/day).

Comparative Example 5

In Comparative Example 5, a laminate E was prepared using a method similar to the one used for the laminate 10-1 of Example 1, except that the TiO$_2$ film, as a barrier layer, was not surface-treated.

Then, the lamination strength before the accelerated durability test was measured using a method similar to Example 1, which gave a result of 2.0 (N/10 mm).

Then, using the high acceleration life test device used in Example 1, the laminate E was exposed to a 105° C./100% RH environment for 96 hours.

After that, the lamination strength of the laminate E of Comparative Example 5 after the accelerated durability test was measured using a method similar to Example 1, which resulted in 0.8 (N/10 mm).

(Summary of Measurement Results of Examples 1 to 3 and Comparative Examples 1 to 5)

As shown in Table 1, it was confirmed that the lamination strength and the barrier properties were enhanced even after the accelerated durability test, owing to forming the TiO$_2$ film as a barrier layer, followed by performing surface treatment for enhancing affinity for the adhesive on a surface of the TiO$_2$ film.

As will be understood from this, by treating a surface of the TiO$_2$ film, followed by attaching the second substrate 14 thereto via the first adhesive layer 13, the laminate is hardly affected by stresses caused by environmental changes or the like. Accordingly, the lamination strength and the gas barrier properties of the laminate can be enhanced.

From the results of Examples 1 and 2, it was confirmed that the lamination strength and the gas barrier properties were more enhanced in the laminate 30-1 of Example 2 where separately prepared substrates were disposed on both surfaces of the first substrate 11, compared with the laminate 10-2 of Example 3 where a separately prepared substrate was disposed only on the first surface 11 to of the first substrate 11.

INDUSTRIAL APPLICABILITY

The present invention is applicable to laminates and gas barrier films used as films for packaging electronic components, such as electroluminescent elements (EL diodes), liquid crystal displays, and semiconductor wafers, films for packaging pharmaceutical products, food products and the like, and films for packaging precision components, and the like.

REFERENCE SIGNS LIST 10, 30 Laminate
11 First substrate
11a First surface
11b Second surface
12 Atomic layer deposition film
12a, 14a, 32a Surface
13 First adhesive layer
14 Second substrate
20, 40 Gas barrier film
31 Second adhesive layer
32 Third substrate

What is claimed is:
1. A laminate comprising:
a first substrate;
an atomic layer deposition film consisting of an titanium oxide layer disposed on a first surface of the first substrate;
a second substrate disposed on a first surface of the atomic layer deposition film; and
a first adhesive layer disposed between the atomic layer deposition film and the second substrate to adhere a first surface of the atomic layer deposition film to the second substrate, and
a second adhesive layer disposed on a second surface of the first substrate;
a third substrate disposed below the second surface of the first substrate, the second surface being on an opposite side to the first surface; and
wherein the second adhesive layer is disposed between the atomic layer deposition film and the third substrate to adhere the atomic layer deposition film to the third substrate,
wherein the first substrate is formed of material having a glass transition point of at least 50° C.,
wherein each of the first adhesive layer and the second adhesive layer is formed of a resin compound having a plurality of hydroxyl groups in a molecule and a polyisocyanate compound,
wherein a thickness of each of the first adhesive layer and the second adhesive layer is 10 µm,
wherein the first surface of the atomic layer deposition film is subjected to plasma surface treatment,
wherein each of the first substrate, the second substrate and the third substrate is made of polyethylene terephthalate (PET) and has a thickness of 100 µm, and
wherein the atomic layer deposition film has a thickness of about 20 nm.

2. The laminate of claim 1, wherein the plasma surface treatment of the first surface of the atomic layer deposition film enhances affinity to the first adhesive layer, and, wherein the first adhesive layer adheres to the treated first surface of the atomic layer deposition film.

3. The laminate of claim 1, wherein when exposed to conditions of 105° C. and 100% relative humidity for ninety-six hours, a 10 mm wide sample of the laminate subjected to 180-degree peeling at 300 mm/min between the inorganic oxide layer and the second substrate exhibited a lamination strength of 5.4 N/10 mm and a water vapor transmission rate of 6.3×10$^{-3}$ g/m$^2$/day.

4. A gas barrier film including the laminate of claim 1.

5. A gas barrier film including the laminate of claim 1, wherein the polyisocyanate compound is cross-linked to the plurality of hydroxyl groups of the resin compound.

6. A laminate for a gas barrier film prepared by a process comprising the steps of:
providing a first substrate,
forming, on a first surface of the first substrate, a barrier film comprising TiO$_2$ via atomic layer deposition;

applying a plasma surface treatment to a first surface of the barrier film, attaching, to the first surface of the barrier film, a second substrate, the second substrate being attached to the first surface via a first adhesive layer, and providing, at a second surface of the first substrate, a third substrate, the third substrate being attached to the first substrate via a second adhesive layer, wherein each of the first adhesive layer and the second adhesive layer is formed of a resin compound having a plurality of hydroxyl groups in a molecule and a polyisocyanate compound, wherein a thickness of each of the first adhesive layer and the second adhesive layer is about 10 µm;

wherein each of the first substrate, the second substrate and the third substrate is made of polyethylene terephthalate (PET) and has a thickness of about 100 µm, and wherein the atomic layer deposition film has a thickness of about 20 nm.

7. The laminate of claim 6, wherein when exposed to conditions of 105° C. and 100% relative humidity for ninety-six hours, a 10 mm wide sample of the laminate subjected to 180-degree peeling at 300 mm/min between the barrier film and the second substrate exhibited a lamination strength of 5.4 N/10 mm and a water vapor transmission rate of $6.3 \times 10^{-3}$ g/m$^2$/day.

* * * * *